(12) United States Patent
Yeh et al.

(10) Patent No.: US 8,772,934 B2
(45) Date of Patent: Jul. 8, 2014

(54) ALUMINUM INTERCONNECTION APPARATUS

(75) Inventors: Ching-Fu Yeh, Hsinchu (TW); Hsiang-Huan Lee, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/596,893

(22) Filed: Aug. 28, 2012

(65) Prior Publication Data

US 2014/0061913 A1    Mar. 6, 2014

(51) Int. Cl.
*H01L 23/48* (2006.01)
*H01L 29/772* (2006.01)

(52) U.S. Cl.
USPC .............. 257/751; 257/E23.01; 257/E21.584; 257/773; 257/774

(58) Field of Classification Search
USPC ............ 257/751, 773, 774, E23.01, E21, 584
See application file for complete search history.

(56) References Cited

U.S. PATENT DOCUMENTS

| | | | |
|---|---|---|---|
| 2008/0191311 A1* | 8/2008 | Wang et al. | 257/532 |
| 2008/0203570 A1* | 8/2008 | Edelstein et al. | 257/751 |
| 2009/0134517 A1* | 5/2009 | Usui et al. | 257/751 |
| 2009/0191535 A1* | 7/2009 | Connelly et al. | 435/2 |
| 2009/0215260 A1* | 8/2009 | Jiang et al. | 438/643 |
| 2010/0154213 A1* | 6/2010 | Koike et al. | 29/874 |
| 2010/0308463 A1* | 12/2010 | Yu et al. | 257/753 |
| 2011/0189850 A1* | 8/2011 | Usui et al. | 438/653 |
| 2011/0309444 A1* | 12/2011 | Maki et al. | 257/347 |
| 2012/0061838 A1* | 3/2012 | Edelstein et al. | 257/751 |
| 2012/0075908 A1* | 3/2012 | Lin et al. | 365/148 |
| 2012/0132966 A1* | 5/2012 | Doris et al. | 257/288 |
| 2012/0206685 A1* | 8/2012 | Takasawa et al. | 349/139 |
| 2012/0228929 A1* | 9/2012 | Froschmeier et al. | 307/9.1 |
| 2013/0015579 A1* | 1/2013 | Guerin et al. | 257/738 |
| 2013/0207101 A1* | 8/2013 | Yamazaki et al. | 257/43 |

\* cited by examiner

*Primary Examiner* — Alexander Oscar Williams
(74) *Attorney, Agent, or Firm* — Slater and Matsil, L.L.P.

(57) ABSTRACT

An aluminum interconnection apparatus comprises a metal structure formed over a substrate, wherein the metal structure is formed of a copper and aluminum alloy, a first alloy layer formed underneath the metal structure and a first barrier layer formed underneath the first alloy layer, wherein the first barrier layer is generated by a reaction between the first alloy layer and an adjacent dielectric layer during a thermal process.

14 Claims, 7 Drawing Sheets

ALUMINUM INTERCONNECTION APPARATUS

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for semiconductor devices having reliable aluminum based interconnection structures.

Aluminum based interconnection structures of a semiconductor device may comprise a plurality of lateral interconnections such as metal lines and a plurality of vertical interconnections such as vias. Various active circuits of the semiconductor may be coupled to external circuits through a variety of conductive channels formed by the vertical and lateral interconnections.

Aluminum based interconnection structures of a semiconductor device can be fabricated using suitable semiconductor fabrication techniques such as etching, Damascene and the like. In an etching based aluminum interconnection fabrication process, an aluminum layer is formed over a semiconductor substrate. According to the pattern of the aluminum interconnection structure, an etching process is applied to the aluminum layer to form a plurality of openings. A dielectric material is filled in the openings to isolate the remaining aluminum layer.

Alternatively, aluminum based interconnection structures may be formed by Damascene processes. Damascene processes can be divided into categories, namely single damascene processes and dual damascene processes. In single damascene technology, a metal via and its adjacent metal line may have different process steps. As a result, each may require a chemical mechanical planarization process to clean the surface. In contrast, in dual damascene technology, a metal via and its adjacent metal line may be formed within a single damascene trench. As a result, one CMP process is required in a dual damascene process to form the metal via and its adjacent metal line.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, an aluminum alloy based interconnection apparatus. The disclosure may also be applied, however, to a variety of semiconductor devices. Hereinafter, various embodiments will be explained in detail with reference to the accompanying drawings.

Figure 1:
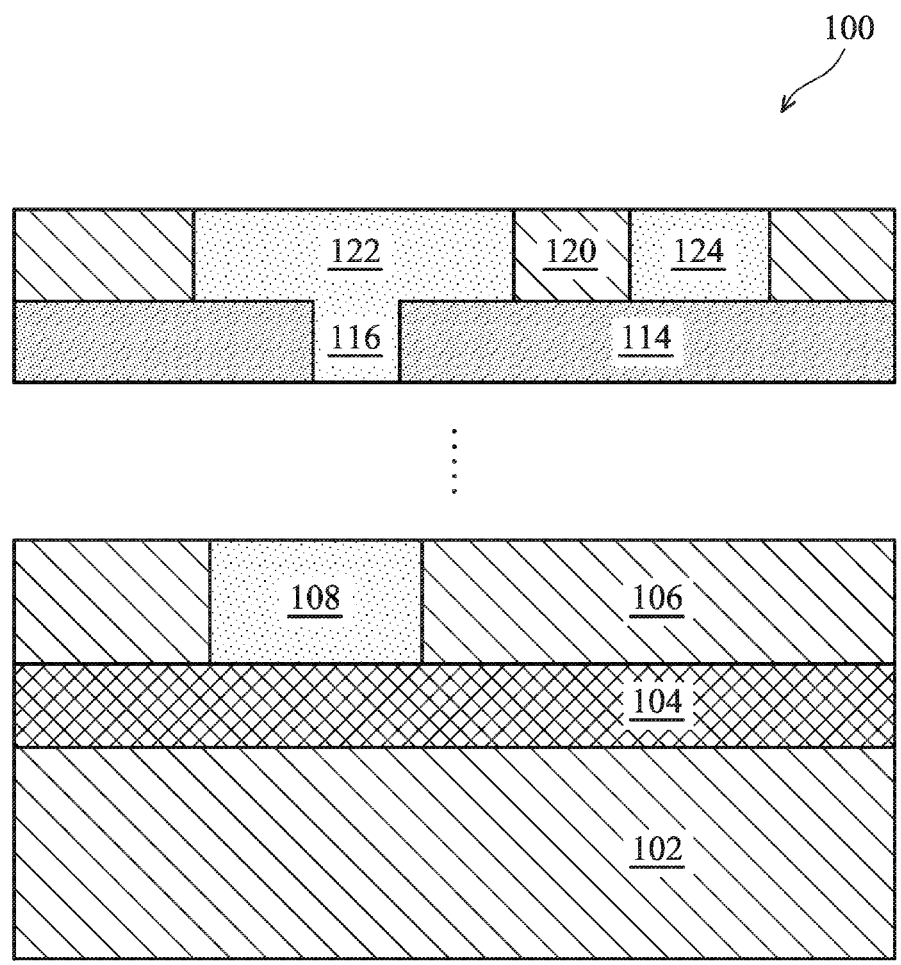
FIG. 1 illustrates a cross sectional view of a semiconductor device having aluminum based interconnection structures in accordance with an embodiment.

FIG. 1 illustrates a cross sectional view of a semiconductor device having aluminum based interconnection structures in accordance with an embodiment. As shown in FIG. 1, the semiconductor device 100 comprises a substrate 102. The substrate 102 may be a silicon substrate. Alternatively, the substrate 102 may be a silicon-on-insulator substrate. The substrate 102 may further comprise a variety of electrical circuits (not shown). The electrical circuits formed on the substrate 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 104 may further comprise a plurality of dielectric layers.

A bottom metal line layer 106 is formed over the interlayer dielectric layer 104. As shown in FIG. 1, the bottom metal line layer 106 may comprise a metal line 108. The metal line 108 is formed of a metal material such as an aluminum copper alloy. In addition, there may be two barrier layers (not shown) formed underneath and on top of the metal line 108 respectively. The bottom metal line layer 106 and the metal line 108 may be formed through any suitable fabrication techniques (e.g., deposition, single damascene and the like). The detailed structure and fabrication steps of the metal line 108 will be described below with respect to FIGS. 2-8.

A top via layer 114 is formed over the bottom metallization layer 106. A top metal line layer 120 is formed over the top via layer 114. As shown in FIG. 1, there may be two metal lines 122 and 124 embedded in the top metal line layer 120. The metal line 122 is coupled to a via 116. The via 116, the metal line 122 and the metal line 124 are formed of metal materials such as an aluminum copper alloy. The metal line 122 and the via 116 form a T-shaped damascene structure. Such a T-shaped damascene structure may be formed by using the dual damascene technique. The detailed structure and formation process of the T-shaped damascene structure will be described below with respect to FIGS. 9-13.

It should be noted while FIG. 1 shows the bottom metal line layer 106 and the top metal line layer 120, one skilled in the art will recognize that one or more inter-metal dielectric layers (not shown) and the associated metallization layers (not shown) are formed between the bottom metal line layer 106 and the top metal line layer 120. In particular, the layers formed over the bottom metal line layer 106 and under the top metal line layer 120 may be formed by alternating layers of lateral interconnection structures (e.g., metal lines) and vertical interconnection structures (e.g., vias).

FIGS. 2-8 illustrate intermediate stages of an etching process of forming the aluminum interconnection structures (e.g., metal line 108) shown in FIG. 1 in accordance with an embodiment. There may be a plurality of interconnection structures in the semiconductor device of FIG. 1. The fabrication techniques of the interconnection structures are similar, and hence only one interconnection structure is selected to illustrate the innovative aspects of various embodiments.

Figure 2:
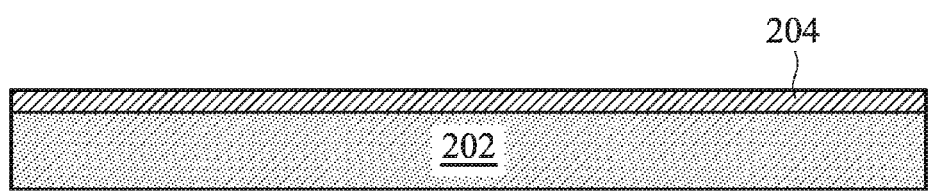
FIG. 2 illustrates a cross sectional view of a semiconductor device after a first alloy layer is formed on a dielectric layer in accordance with an embodiment.

FIG. 2 illustrates a cross sectional view of a semiconductor device after a first alloy layer is formed on a dielectric layer in accordance with an embodiment. As shown in FIG. 2, the first alloy layer 204 is formed on top of the dielectric layer 202. The first alloy layer 204 is formed of copper alloys including copper manganese alloys, copper chromium alloys, copper vanadium alloys, copper niobium alloys, copper titanium alloys, any combinations thereof and the like. The first alloy layer 204 may be formed by using suitable fabrication techniques such as CVD, physical vapor deposition (PVD) and the like.

Figure 3:
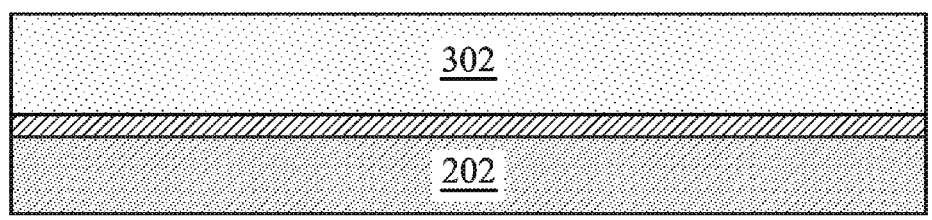
FIG. 3 illustrates a cross sectional view of the semiconductor device shown in FIG. 2 after an aluminum layer is formed on the first alloy layer in accordance with an embodiment.

FIG. 3 illustrates a cross sectional view of the semiconductor device shown in FIG. 2 after an aluminum layer is formed on the first alloy layer in accordance with an embodiment. The aluminum layer 302 may be formed of suitable fabrication techniques such as sputtering, PVD, CVD, electrochemical plating and the like. The thickness of the aluminum layer 302 is in a range from about 3000 angstroms to about 10000 angstroms. It should be noted that the thickness of the aluminum layer 302 is determined based upon the current carrying ability of the interconnection structures. The thickness range described above is selected purely for demonstration purposes and is not intended to limit the various embodiments of the present invention to any particular thickness.

Figure 4:
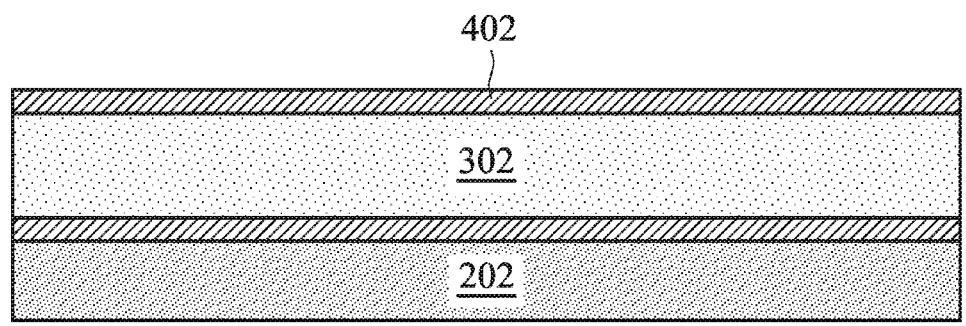
FIG. 4 illustrates a cross sectional view of the semiconductor device shown in FIG. 3 after a second alloy layer is formed on the aluminum layer in accordance with an embodiment.

FIG. 4 illustrates a cross sectional view of the semiconductor device shown in FIG. 3 after a second alloy layer is formed on the aluminum layer in accordance with an embodiment. As shown in FIG. 4, the second alloy layer 402 is formed on top of the aluminum layer 302. The second alloy layer 402 is formed of copper alloys including copper manganese alloys, copper chromium alloys, copper vanadium alloys, copper niobium alloys, copper titanium alloys, any combinations thereof and the like. The second alloy layer 402 may be formed by using suitable fabrication techniques such as CVD, PVD and the like.

Figure 5:
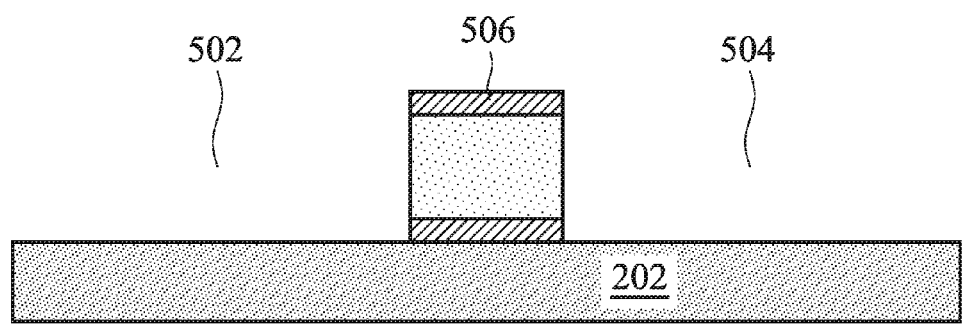
FIG. 5 illustrates a cross sectional view of the semiconductor device shown in FIG. 4 after an etching process is applied to the alloy layers and the aluminum layer in accordance with an embodiment.

FIG. 5 illustrates a cross sectional view of the semiconductor device shown in FIG. 4 after an etching process is applied to the alloy layers and the aluminum layer in accordance with an embodiment. The alloy layers (e.g., 204 and 402) and the aluminum layer 302 are etched according to the pattern of the interconnect structure (e.g., metal line 108) of the semiconductor device. A plurality of openings such as 502 and 504 are formed by using suitable etching processes including dry etching such as reactive ion etching (RIE). The remaining portion of the alloy layers and the aluminum layer form an interconnection structure 506. As shown in FIG. 5, the interconnection structure 506 includes two alloy layers and an aluminum layer sandwiched between two alloy layers.

Figure 6:
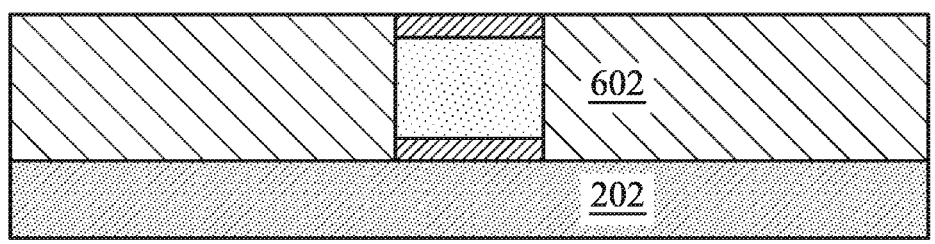
FIG. 6 illustrates a cross sectional view of the semiconductor device shown in FIG. 5 after a dielectric material is filled in the openings shown in FIG. 5 in accordance with an embodiment.

FIG. 6 illustrates a cross sectional view of the semiconductor device shown in FIG. 5 after a dielectric material is filled in the openings shown in FIG. 5 in accordance with an embodiment. A dielectric material is filled in the openings 502 and 504 (shown in FIG. 5) to form a first inter-metal dielectric (IMD) layer 602. The first IMD layer 602 may be formed of a low-K dielectric material, such as silicon oxide, fluorosilicate glass (FSG), Spin-On-Glass, Spin-On-Polymers, silicon carbon material, compounds thereof, composites thereof and the like. The first IMD layer 602 may be formed by suitable fabrication process such as CVD, PECVD, high-density plasma chemical vapor deposition (HDPCVD) or the like.

Figure 7:
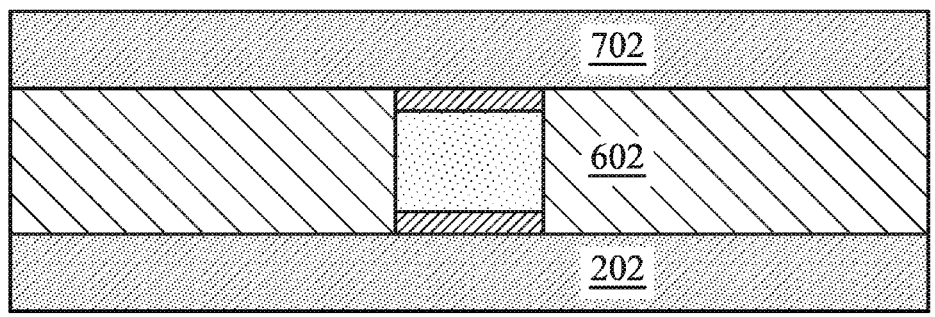
FIG. 7 illustrates a cross sectional view of the semiconductor device shown in FIG. 6 after a second IMD layer is formed over the first IMD layer in accordance with an embodiment.

FIG. 7 illustrates a cross sectional view of the semiconductor device shown in FIG. 6 after a second IMD layer is formed over the first IMD layer in accordance with an embodiment. The formation of the second IMD layer 702 is similar to that of the first IMD layer 602, and hence is not discussed herein to avoid repetition.

Figure 8:
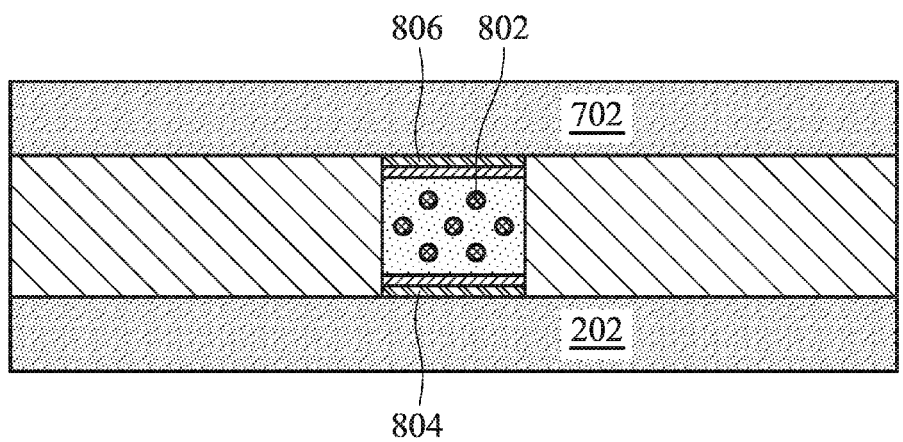
FIG. 8 illustrates a cross sectional view of the semiconductor device shown in FIG. 7 after a thermal process is applied to the semiconductor device in accordance with an embodiment.

FIG. 8 illustrates a cross sectional view of the semiconductor device shown in FIG. 7 after a thermal process is applied to the semiconductor device in accordance with an embodiment. The semiconductor device shown in FIG. 7 is placed in a high temperature environment to help copper dissolve into the aluminum layer 302. In accordance with an embodiment, the temperature of the thermal process is in a range from 300 degrees to 660 degrees. Copper particles 802 dissolve into the aluminum layer and form a copper aluminum alloy layer. The percentage of copper in such an aluminum copper alloy layer is in a range from about 0.5% to about 5.5%.

One advantageous feature of having an aluminum copper alloy layer is that the aluminum atoms may be of a plurality of high quality {111} crystal planes because the aluminum atoms may inherit some of the characteristics of other elements (e.g., copper) of the alloy. In particular, the aluminum atoms of the aluminum copper alloy may be of the same packed planes (e.g., the {111} close packed planes) as the copper of the alloy. Such {111} crystal planes help to enhance the structural integrity. As a result, the electro-migration issue may be improved. Another advantageous feature of having an aluminum copper alloy layer is that the aluminum layer and the copper alloy layer may form metal-to-metal boding rather than conventional metal-to-ceramic boding (e.g., Al-to-TiN). The metal-to-metal bonding helps to reduce the stress induced mismatch in the semiconductor device.

FIG. 8 further illustrates two metal oxide or metal silicide layers after the thermal process is applied to the semiconductor device. As described above with respect to FIGS. 2 and 4, the first alloy layer and the second alloy layer may be formed of copper manganese alloys, copper chromium alloys, copper vanadium alloys, copper niobium alloys, copper titanium alloys. After the copper portion of the alloy dissolves into the aluminum layer, the remaining metals (e.g., manganese) may diffuse into the dielectric layers (e.g., 202 and 702) adjacent to the first alloy layer and the second alloy layer respectively. Such a diffusion process leads to two barrier layers 802 and 804 respectively. The barrier layers 802 and 804 are formed of metal oxide or metal silicide.

One advantageous feature having the barrier layers formed of metal oxide or metal silicide is that this self-forming barrier of metal oxide or silicide may help to prevent copper from diffusing into the surrounding dielectric film.

Figure 9:
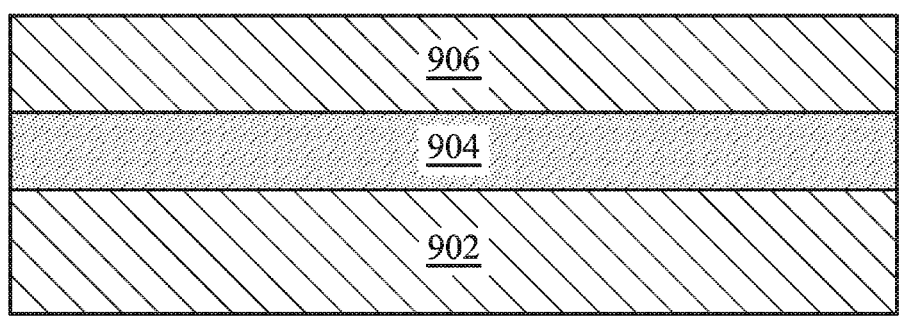
FIG. 9 illustrates a semiconductor device prior to the formation of the interconnection structure in accordance with an embodiment.

FIGS. 9-13 illustrate intermediate stages of a dual damascene process of forming the aluminum interconnection structures shown in FIG. 1 in accordance with an embodiment. FIG. 9 illustrates a semiconductor device prior to the formation of the interconnection structure in accordance with an embodiment. The dielectric layer 902 is similar to the dielectric layer 202 shown in FIG. 2, and hence is not discussed herein. The first IMD layer 904 and the second IMD layer 906 are formed over the dielectric layer 902. The formation of the IMD layers 904 and 906 is similar to the IMD layer 702 shown in FIG. 7, and hence is not discussed again. It should be noted that according to the dual damascene process, the first IMD layer 904 and the second IMD layer 906 are alternatively referred to as a via IMD layer 904 and a trench IMD layer 906 respectively.

Figure 10:
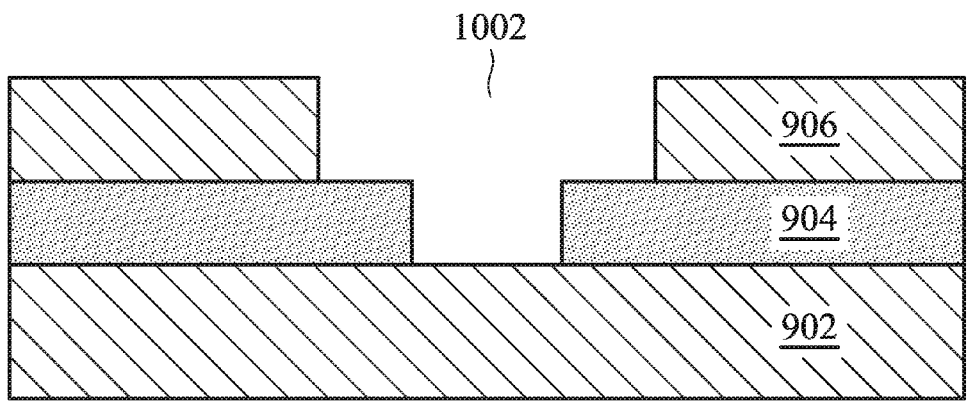
FIG. 10 illustrates a cross sectional view of the semiconductor device shown in FIG. 9 after an opening is formed in the first IMD and the second IMD layer in accordance with an embodiment.

FIG. 10 illustrates a cross sectional view of the semiconductor device shown in FIG. 9 after an opening is formed in the first IMD and the second IMD layer in accordance with an embodiment. The opening 1002 may be formed by etching the first IMD layer 904 and the second IMD layer 906 respectively. The first IMD layer 904 and the second IMD layer 906 may be of different etching characteristics. As a result, the first IMD layer 904 may function as an etch stop layer when the second IMD layer 906 is etched. After the trench is formed, another etching process is applied to the first IMD layer 904 to form the via.

According to another embodiment, the opening may be formed by using two photolithographic patterning and anisotropic etching steps. In particular, a via opening is first formed through a first photolithographic patterning process and a first etching process. After the via is formed, similar patterning and etching processes are applied to the semiconductor device again to form an overlying trench opening. As shown in FIG. 10, the via opening and the trench opening form a T-shaped damascene structure.

Figure 11:
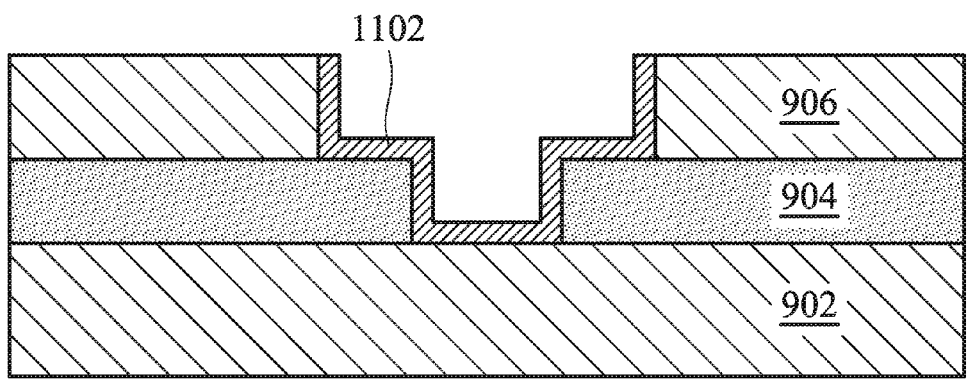
FIG. 11 illustrates a cross sectional view of the semiconductor device shown in FIG. 10 after an alloy layer is formed on the bottom and the sidewalls of the opening shown in FIG. 10 in accordance with an embodiment.

FIG. 11 illustrates a cross sectional view of the semiconductor device shown in FIG. 10 after an alloy layer is formed on the bottom and the sidewalls of the opening shown in FIG. 10 in accordance with an embodiment. As shown in FIG. 11, the alloy layer 1102 is formed on the interior surface of the opening 1002. The alloy layer 1102 is formed of copper alloys including copper manganese alloys, copper chromium alloys, copper vanadium alloys, copper niobium alloys, copper titanium alloys, any combinations thereof and the like. Alternatively, the second alloy layer 1102 may be replaced by a reactive manganese film. The second alloy layer 1102 may be formed by using suitable semiconductor fabrication techniques such as CVD, PVD and the like.

Figure 12:
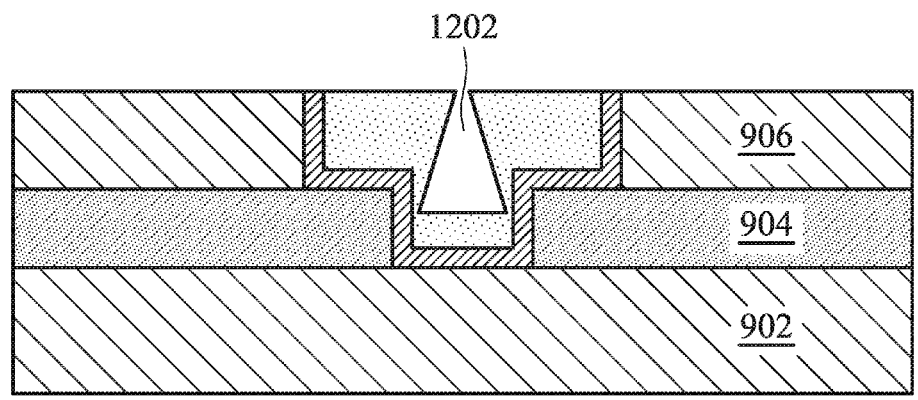
FIG. 12 illustrates a cross sectional view of the semiconductor device shown in FIG. 11 after a conductive material is deposited into the opening shown in FIG. 11 in accordance with an embodiment.

FIG. 12 illustrates a cross sectional view of the semiconductor device shown in FIG. 11 after a conductive material is deposited into the opening shown in FIG. 11 in accordance with an embodiment. The conductive material may be aluminum. The conductive material may be deposited into the opening using suitable techniques such as sputtering and the like. It should be noted that the sputtering process may not fully fill the opening. There may be an overhang 1202, which leads to a void or a plurality of voids embedded in the aluminum material filled in the opening.

Figure 13:
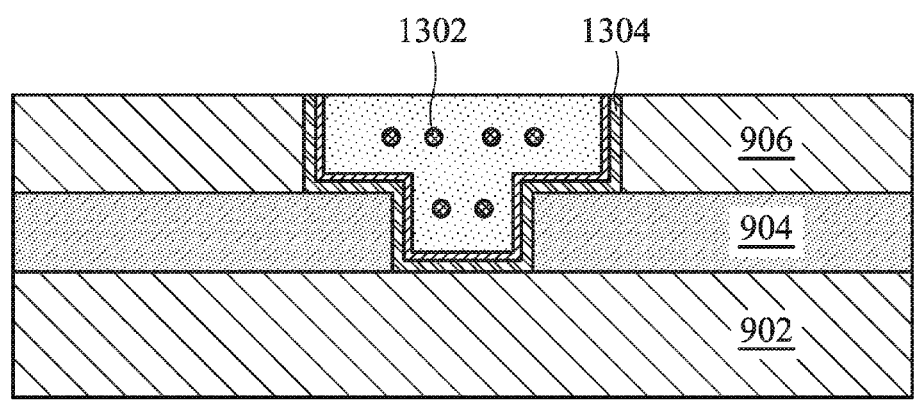
FIG. 13 illustrates a cross sectional view of the semiconductor device shown in FIG. 12 after a thermal process is applied to the semiconductor device in accordance with an embodiment.

FIG. 13 illustrates a cross sectional view of the semiconductor device shown in FIG. 12 after a thermal process is applied to the semiconductor device in accordance with an embodiment. The semiconductor device shown in FIG. 12 is placed in a high temperature environment, which helps to melt the metal material (e.g., aluminum). The melted material fills the void show in FIG. 12. In addition, the high temperature helps copper dissolve into the aluminum layer. According to an embodiment, the temperature of the thermal process is in a range from 300 degrees to 548 degrees. Copper particles 1302 dissolve into the aluminum layer form a copper aluminum alloy, even some compound formation (e.g., $CuAl_2$). Alternatively, if the alloy layer is a manganese film, the manganese film may react with the aluminum layer to form $MnAl_6$. After the thermal process, a chemical mechanical polish (CMP) process is employed to remove overlying copper and polish the surface.

One advantageous feature of having an aluminum copper alloy layer is that the aluminum may form a plurality of high quality {111} crystal planes because the aluminum atoms may inherit some of the characteristics of other elements of the alloy. In particular, the aluminum atoms of the alloy may be of the same packed planes (e.g., the {111} close packed planes) as the copper of the alloy. Such {111} crystal planes help to enhance the structural integrity. As a result, the electro-migration issue may be reduced. In addition, the thermal process described above helps to improve the uniformity of the top surface of the semiconductor device shown in FIG. 13. As a result, the uniformity improvement is due to aluminum overburden reduction that can shorten the CMP process time so as to improve resistance (Rs) uniformity.

FIG. 13 further illustrates a metal oxide or metal silicide layer after the thermal process is applied to the semiconductor device. As described above with respect to FIG. 11, the alloy layer 1102 may be formed of copper manganese alloys, copper chromium alloys, copper vanadium alloys, copper niobium alloys, copper titanium alloys. After the copper portion of the alloy dissolves into the aluminum layer, the remaining metals (e.g., manganese) may diffuse into the dielectric layers (e.g., 902, 904 and 906) adjacent to the alloy layer 1102. Such a diffusion process leads to a barrier layer 1304 formed of metal oxide or metal silicide.

One advantageous feature is that the aluminum layer and the copper layers form metal-to-metal bonding rather than conventional metal-to-ceramic bonding. The metal-to-metal bonding helps to reduce the stress induced mismatch between two adjacent layers. In addition, the copper portion of the alloy may react with the aluminum layer to generate a good gap-fill material. Such a gap-fill material helps to reliably fill the void shown in FIG. 12.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a metal structure formed over a substrate, wherein the metal structure is formed of a copper and aluminum alloy;
a first alloy layer formed underneath the metal structure, wherein the first alloy layer is formed of copper and a first conductive metal, and wherein the first conductive metal is selected from the group consisting of manganese, chromium, vanadium, niobium and titanium; and
a first barrier layer formed underneath the first alloy layer, wherein the first barrier layer is generated by a first reaction between the first alloy layer and an adjacent first dielectric layer during a thermal process, and wherein the first barrier layer comprises the first conductive metal.

2. The apparatus of claim 1, wherein the metal structure is a metal line.

3. The apparatus of claim 2, further comprising:
a second alloy layer formed over the metal structure; and
a second barrier layer formed over the second alloy layer, wherein the second barrier layer is generated by a second reaction between the second alloy layer and an adjacent second dielectric layer during the thermal process.

4. The apparatus of claim 1, wherein the metal structure is a T-shaped damascene structure comprising:
a via portion formed in a first inter-metal dielectric layer; and
a trench portion formed in a second inter-metal dielectric layer, wherein the second inter-metal dielectric layer is formed on the first inter-metal dielectric layer.

5. The apparatus of claim 1, wherein the first barrier layer is formed of a metal oxide material.

6. The apparatus of claim 1, wherein the first barrier layer is formed of a metal silicide material.

7. The apparatus of claim 1, wherein aluminum atoms of the metal structure are of {111} crystal planes.

8. A device comprising:
a substrate comprising silicon;
a first inter metal dielectric layer formed over the silicon;
a metal via formed in the first inter metal dielectric layer, wherein the metal via is formed of an aluminum copper alloy, and wherein aluminum atoms of the aluminum copper alloy are of {111} crystal planes;
a second inter metal dielectric layer formed over the first inter metal dielectric layer; and
a metal line formed in the second inter metal dielectric layer, wherein the metal line is formed of the aluminum copper alloy.

9. The device of claim 8, wherein the metal via and the metal line form a T-shaped metal structure.

10. The device of claim 9, further comprising:
a first alloy layer formed underneath the T-shaped metal structure; and
a first barrier layer formed underneath the first alloy layer.

11. The device of claim 10, wherein the first barrier layer is formed by a reaction between the first alloy layer and adjacent dielectric materials during a first thermal process.

12. The device of claim 8, further comprising:
a second alloy layer formed underneath the metal line;
a second barrier layer formed underneath the second alloy layer;
a third alloy layer formed over the metal line; and
a third barrier layer formed over the third alloy layer.

13. The device of claim 12, wherein:
the second barrier layer is generated by a second reaction between the second alloy layer and adjacent dielectric materials during a thermal process; and
the third barrier layer is generated by a third reaction between the third alloy layer and adjacent dielectric materials during the thermal process.

14. The device of claim 13, wherein the thermal process is of a temperature from 300 degrees to 660 degrees.

* * * * *